(12) United States Patent
Cari-an et al.

(10) Patent No.: US 9,698,085 B1
(45) Date of Patent: Jul. 4, 2017

(54) LEADFRAME STRIP ASSEMBLY AND METHOD OF PROCESSING

(71) Applicant: Texas Instruments Incorporated, Dallas, TX (US)

(72) Inventors: Rex Araneta Cari-an, Laguna (PH); Ruby Ann Merto Camenforte, Pampanga (PH); Roxanna Bauzon Samson, Benguet (PH); Glenn Juan Morado, Pasig (PH)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/978,425

(22) Filed: Dec. 22, 2015

(51) Int. Cl.
*H01L 23/495* (2006.01)
*H01L 23/31* (2006.01)
*H01L 21/48* (2006.01)
*H01L 21/56* (2006.01)
*H01L 23/00* (2006.01)

(52) U.S. Cl.
CPC .... *H01L 23/49565* (2013.01); *H01L 21/4842* (2013.01); *H01L 21/561* (2013.01); *H01L 21/565* (2013.01); *H01L 23/3107* (2013.01); *H01L 24/97* (2013.01); *H01L 2924/14* (2013.01)

(58) Field of Classification Search
CPC .......... H01L 23/49565; H01L 23/3107; H01L 21/4842; H01L 21/561; H01L 21/565
USPC ........................................................ 257/676
See application file for complete search history.

(56) References Cited

U.S. PATENT DOCUMENTS

2015/0332989 A1* 11/2015 Samson ............ H01L 23/49541
257/670

* cited by examiner

*Primary Examiner* — Anthony Ho
(74) *Attorney, Agent, or Firm* — Jacqueline J. Garner; Charles A. Brill; Frank D. Cimino

(57) ABSTRACT

A method of processing a leadframe strip having opposite first and second longitudinal ends and a plurality of leadframe panels positioned between the first and second longitudinal ends, each of the leadframe panels including an array of leadframe portions. The method includes saw cutting the leadframe rails and panels with a plurality of laterally extending saw cuts that each extend through the first and second rails and a panel connector portion of the leadframe strip positioned between adjacent panels of the leadframe strip. A method of reducing blade heating during leadframe strip singulation is described. Leadframe strip assemblies are also described.

10 Claims, 14 Drawing Sheets

LEADFRAME STRIP ASSEMBLY AND METHOD OF PROCESSING

BACKGROUND

Integrated circuit ("IC") packages typically include one or more integrated circuit dies that are mounted on and electrically connected to a leadframe. The die and leadframe are encapsulated in plastic mold compound. Portions of the leadframe are exposed through the mold compound enabling the die to be connected to external circuits.

During IC package formation, structure that will eventually become leadframes are initially integrally connected leadframe portions of a leadframe strip. Dies are mounted on and electrically connected to each of these leadframe portions while the leadframe portions remain integrally connected in the leadframe strip. The dies mounted on each of the leadframe portions are generally wire bonded connected to leads of a leadframe portion on which they are mounted and are subsequently encapsulated in mold compound. This molded leadframe strip assembly is then sawed (singulated/diced) to separate the assembly into individual IC packages, each containing a leadframe and at least one die.

SUMMARY

A method of processing a leadframe strip having opposite first and second longitudinal ends and a plurality of leadframe panels positioned between the first and second longitudinal ends with a longitudinally extending leadframe rail positioned on opposite lateral sides of the leadframe strip and extending from the first longitudinal end to the second longitudinal end of the leadframe strip, each of the leadframe panels comprising an array of leadframe portions. The method includes moving the leadframe strip to a sawing station; and cutting the leadframe rails and panels with a plurality of laterally extending saw cuts that each extend through the first and second rails and a panel connector portion of the leadframe strip positioned between adjacent panels of the leadframe strip.

A method of reducing blade heating during leadframe strip singulation includes moving a leadframe strip to a saw station and cross cutting rails of the leadframe strip at portions thereof aligned with laterally extending slots positioned between panels of the leadframe strip.

A leadframe strip assembly includes a leadframe strip having opposite first and second longitudinal ends and a plurality of leadframe panels positioned between the first and second longitudinal ends. Each of the leadframe panels includes an array of leadframe portions. First and second longitudinally extending rails extend from the first longitudinal end to the second longitudinal end of the leadframe strip and are positioned on first and second lateral sides of the plurality of leadframe panels and are integrally connected to the leadframe panels. A plurality of laterally extending panel connector portions are positioned between adjacent leadframe panels and integrally connect the adjacent leadframe panels. The panel connector portions each have a laterally extending slot positioned inwardly of the first and second rails. At least one of the laterally extending panel connector portions is at least partially severed by a laterally extending saw cut that extends through at least one of the longitudinally extending rails in alignment with a connector portion slot.

DETAILED DESCRIPTION

In the process of forming integrated circuit packages, integrated circuit (IC) dies are mounted on die attach pads of integrally connected leadframe portions of a leadframe strip. The dies are wire bonded or otherwise electrically connected to leads of each leadframe portion. Then the entire leadframe strip is molded, covering the dies and parts of the leadframe portions with mold compound such as plastic. The die-mounted and molded leadframe strip is then saw cut in multiple cutting operations that are performed in a series of four "channels." The leadframe strip has a predetermined orientation on a saw table during the first channel and is repositioned on the saw table after the sawing operations of each channel.

Figure 1:
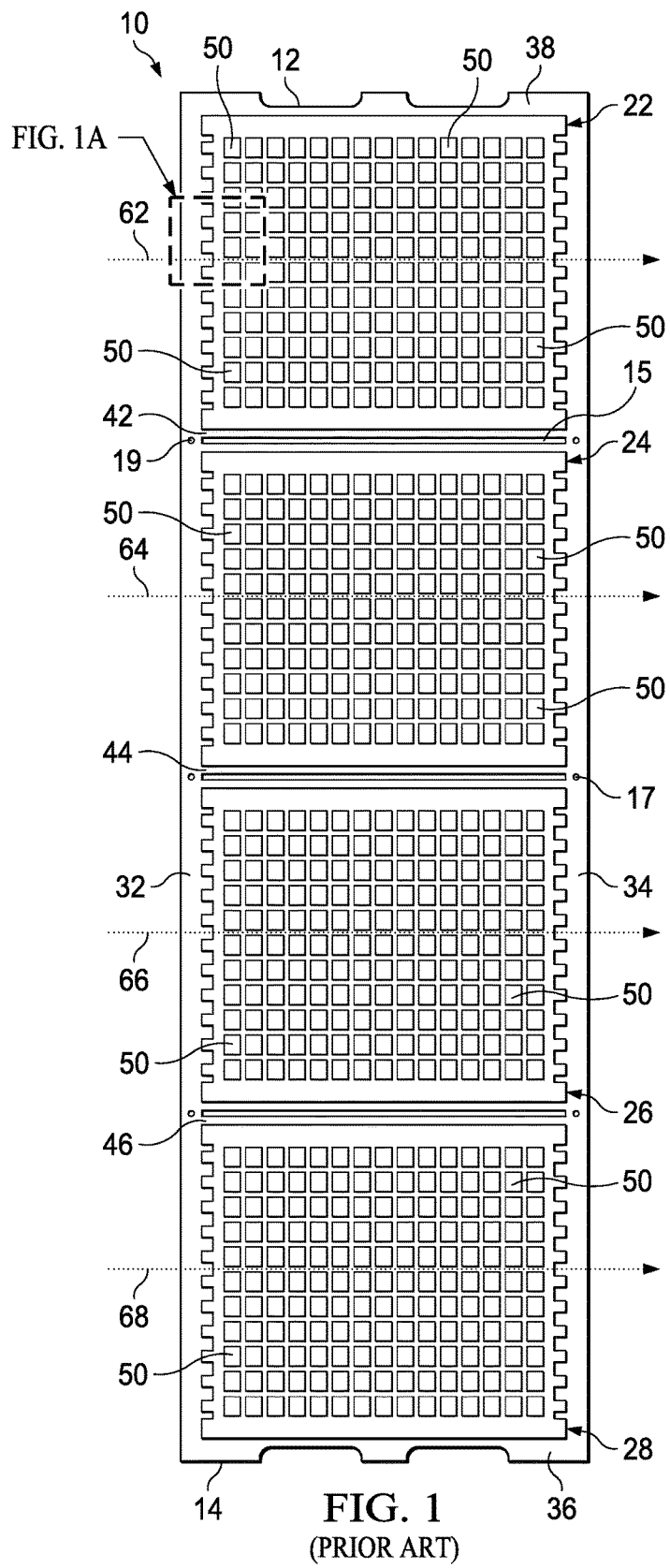
FIG. 1 is a top plan view of a die-mounted and molded leadframe strip illustrating prior art channel 1 sawing (singulation/dicing) processes performed on the molded strip.
Figure 1A:
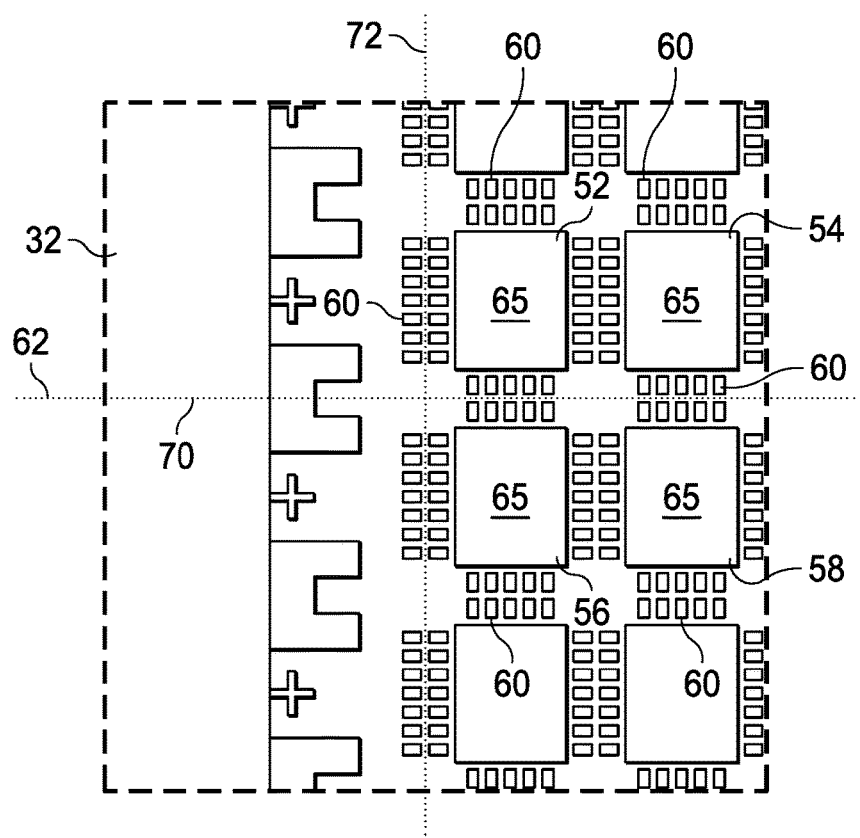
FIG. 1A is a detail portion of FIG. 1 with dies and mold compound removed to show certain leadframe detail in a region that is to be saw cut.
Figure 1B:
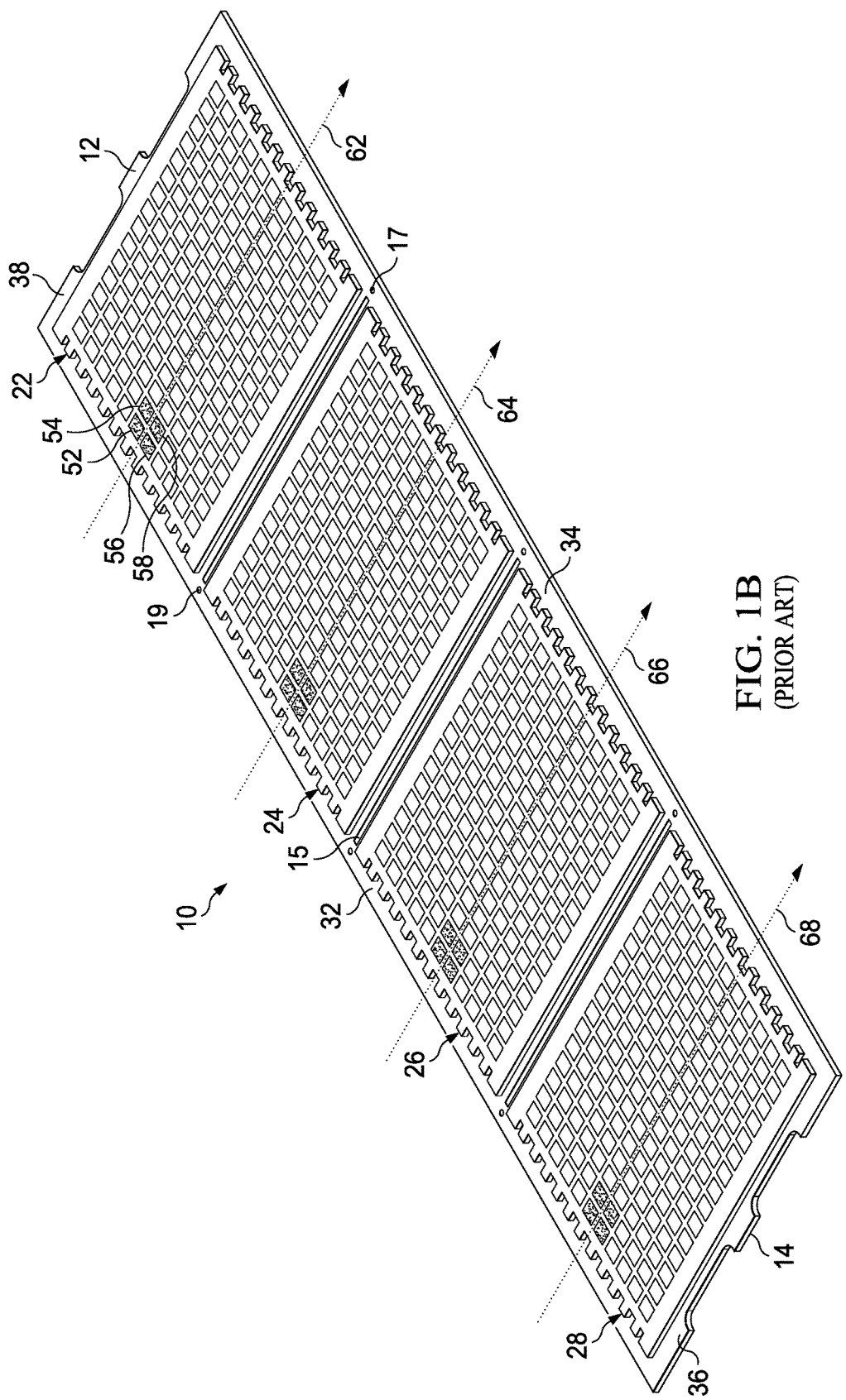
FIG. 1B is a schematic isometric view of the leadframe strip of FIG. 1, illustrating heating of certain leadframe portions of leadframe panels resulting from saw cuts.

FIG. 1 is a top plan view of a die-mounted and molded leadframe strip 10 illustrating prior art channel 1 processes performed on the molded strip 10. The IC dies (not shown) are positioned beneath the mold compound and are not visible on the molded leadframe strip 10 shown in FIG. 1. FIG. 1A is a top, detail from FIG. 1 with dies and mold compound removed to show certain leadframe detail in a region that is to be saw cut. FIG. 1B is a schematic isometric view illustrating prior art channel 1 processes performed on the strip and showing resulting heating of certain leadframe portions of leadframe panels.

Figure 1C:
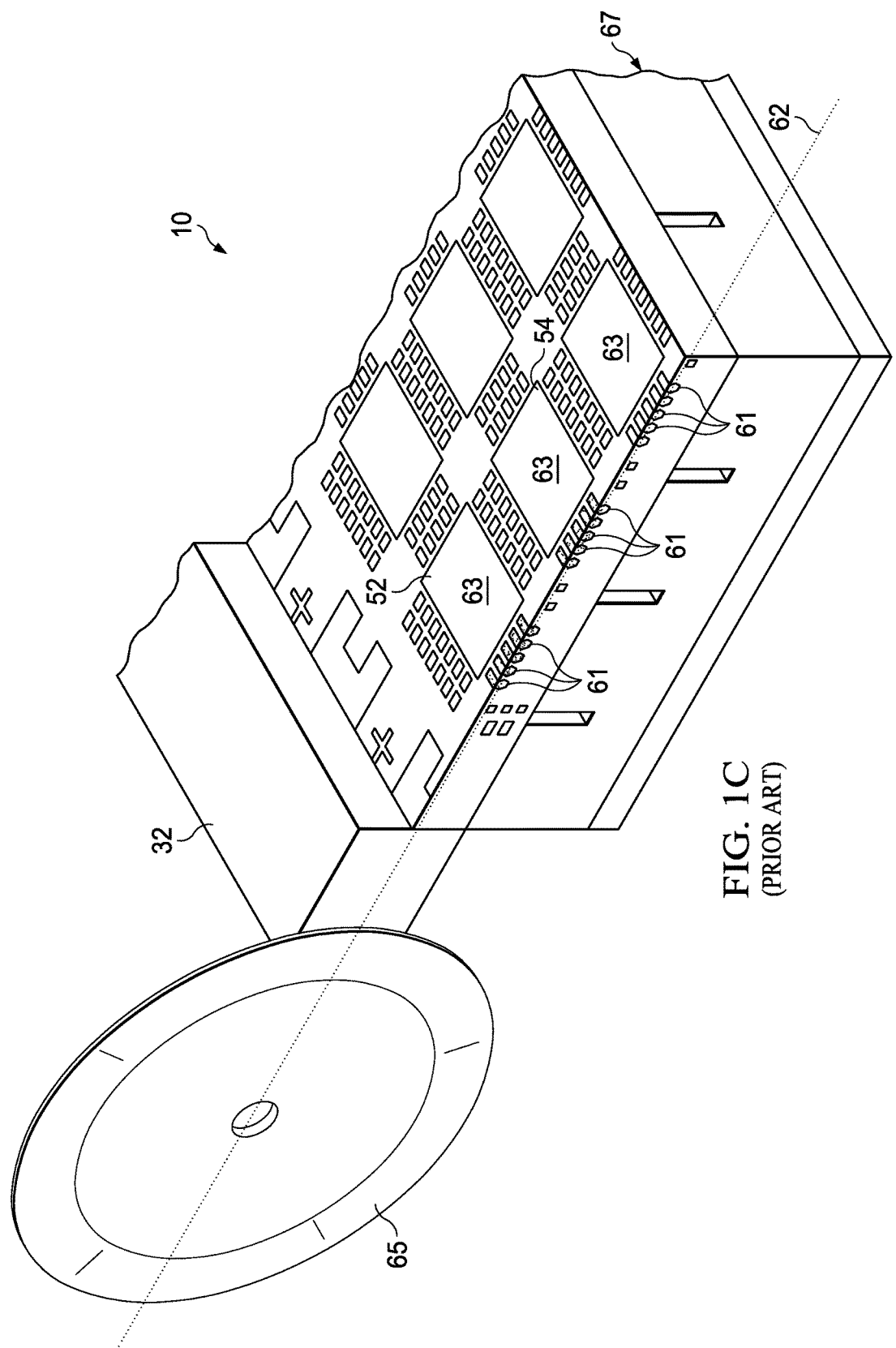
FIG. 1C is an isometric, broken away view of a sawed portion of the leadframe strip of FIG. 1 supported on a saw table.

The leadframe strip 10 illustrated in FIGS. 1-1C has first and second longitudinal ends 12, 14. First, second, third, and fourth panels 22, 24, 26, 28 are positioned between the two longitudinal ends 12, 14. First and second longitudinally extending rails 32, 34 are provided on lateral sides of the panels 22, etc. The panels 22, 24, 26, 28 each have a metal sheet thickness that is smaller than the thickness of the rails, e.g., half the thickness of the rails. First and second laterally extending end rails 36, 38 are positioned at the ends 12, 14 of the leadframe strip 10. The four panels 22, 24, 26, 28 are connected to one another by first, second and third metal plate connector portions 42, 44, 46, which have the same thickness as the panels 22, etc. Each of the four panels 22, 24, 26, 28 comprises an array of integrally connected leadframe portions 50, FIG. 1, which include individual leadframe portions 52, 54, 56, 58, etc., as shown in FIGS. 1A and 1B. The leadframe portions 50 are arranged in a rectangular grid of rows and columns. In the illustrated embodiment the rectangular grid has 11 laterally extending rows and 15 longitudinally extending columns of integrally connected leadframe portions 50, but the grid may have any desired number of rows and columns. Lateral saw cuts 62, 64, 66, 68 are made along four saw paths or "streets" in the channel 1 process, as best shown in FIGS. 1 and 1B. These four lateral saw cuts each extend entirely across each panel and through the rails 32, 34 on each lateral side of the panel.

FIG. 1A is a top plan view, detail from FIG. 1 with dies and mold compound removed to show certain leadframe detail in a region that is to be saw cut. As best shown by FIG. 1A, the individual leadframe portions 50, including leadframe portions 52, 54, 56, 58, within each panel 22, 24, 26, 28 are integrally connected by a web 60 of lead portions that surrounds a centrally positioned leadframe die attach pad 65 in each leadframe portion, e.g., 52, 54, 56, 58.

FIG. 1B is a schematic isometric view illustrating a prior art channel 1 saw cut 62, 64, 66, 68 performed on the leadframe strip 10. FIG. 1C is an isometric, broken away view of a sawed portion of the leadframe strip 10 of FIG. 1 supported on a saw table 67. The thickness of the metal in each panel 22, 24, 26, 28 is substantially less, e.g., half the thickness, of the longitudinally extending rails 32, 34. In FIG. 1C a saw blade 65 has just performed saw cut 62 that separates adjacent leadframe portions. Because the rails 32, 34 are relatively thick, the saw blade 65 becomes heated by friction as it cuts through a rail, e.g., 32, FIG. 1C. The heated blade 65 then heats and blackens the leads, e.g., 61 of the first two leadframe portions, e.g. 52, 54, FIG. 1C, and opposite leadframe portions 56, 58, FIG. 1B, which the saw encounters after cutting through the rail 32. The blackened leads are indicated with speckle shading in FIGS. 1B and 1C. Blackened leads 61, FIG. 1C, are undesirable because they increase the electrical resistance of the lead and produce a poor appearance to customers. Each of the saw cuts 62, 64, 66, 68 is formed at a mid-portion of each leadframe panel 22, 24, 26 and 28. The same type defects are produced in the first two leadframe portions, e.g., leadframe portions 52, 54, along each of the four saw cuts 62, 64, 66 and 68.

Figure 2:
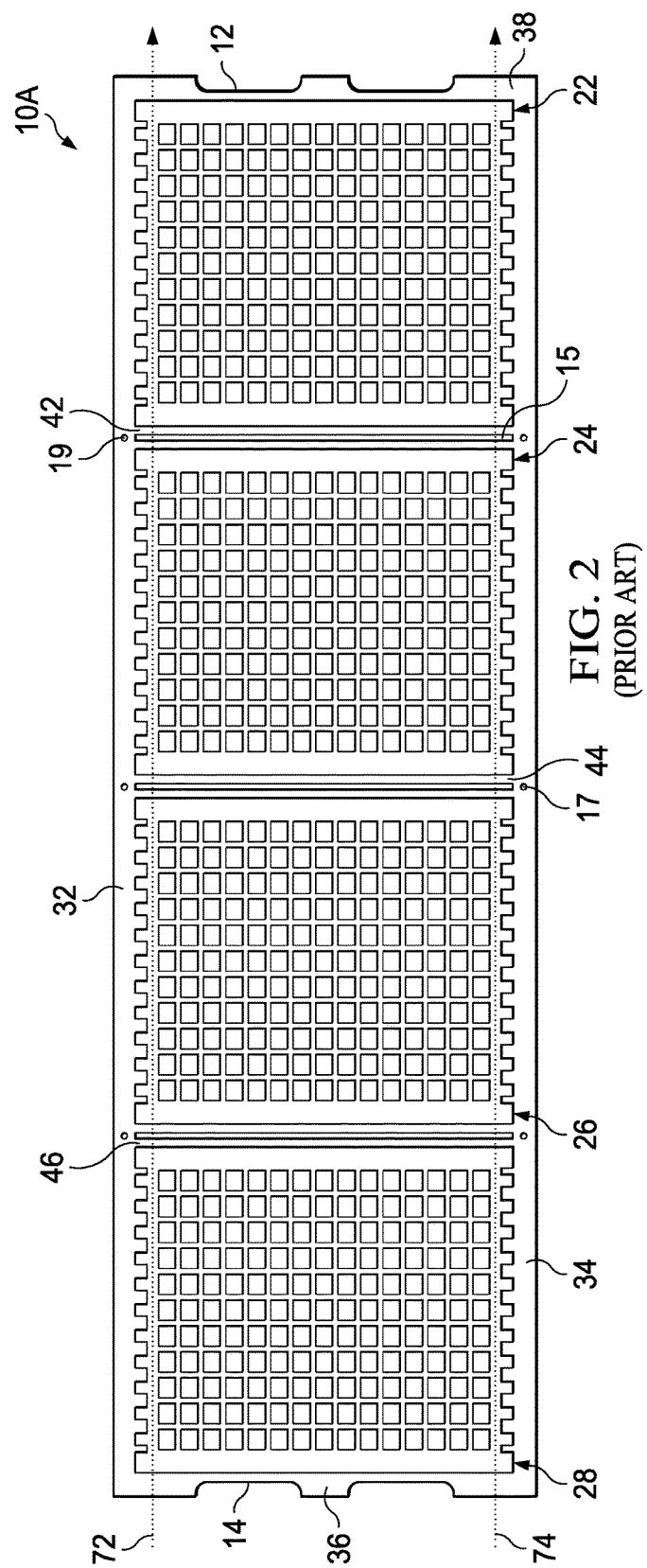
FIG. 2 is a top plan view of the leadframe strip of FIG. 1, illustrating prior art channel 2 processes performed thereon.

FIG. 2 is a top plan view of the leadframe strip 10A after channel 1 processing, illustrating prior art channel 2 processes performed thereon. During this channel 2 processing, the leadframe strip 10A is reoriented on the saw table in an orientation perpendicular to its original orientation in the channel 1 processing. Parallel saw cuts 72, 74 are then made that extend longitudinally along the lateral edges of the panels to separate the rails 32, 34 from the leadframe strip 10A. These saw cuts 72, 74 are made in normal plate thickness portions of the lead panel adjacent to the thicker rails and thus do not produce excessive blade heating.

Figure 3:
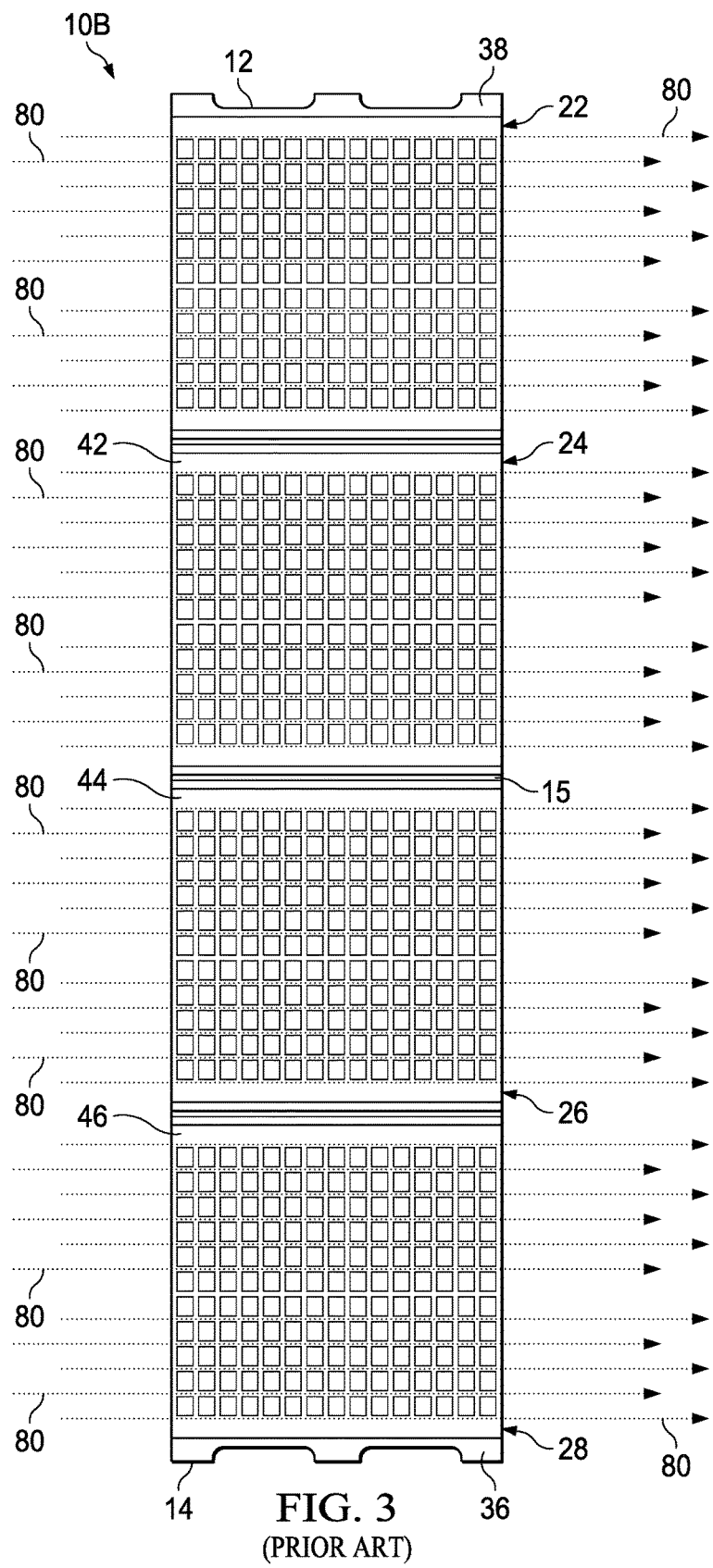
FIG. 3 is a top plan view of the leadframe strip of FIG. 2, illustrating prior art channel 3 processes performed thereon.

FIG. 3 is a top plan view of the processed leadframe strip 10B after channel 2 processing, illustrating prior art channel 3 processes performed thereon. During channel 3 processing the remaining portion of the leadframe strip 10B is again rotated 90 degrees to reoriented it with the saw table. Then, a plurality of laterally extending saw cuts 80 are produced. These saw cuts 80 separate longitudinally adjacent leadframe portions 50. These laterally extending saw cuts 80, in addition to the laterally extending saw cuts 62, 64, 66, 68 made in channel 1 cutting, separate all longitudinally adjacent leadframe portions 50 on the leadframe sheet 10.

Figure 4:
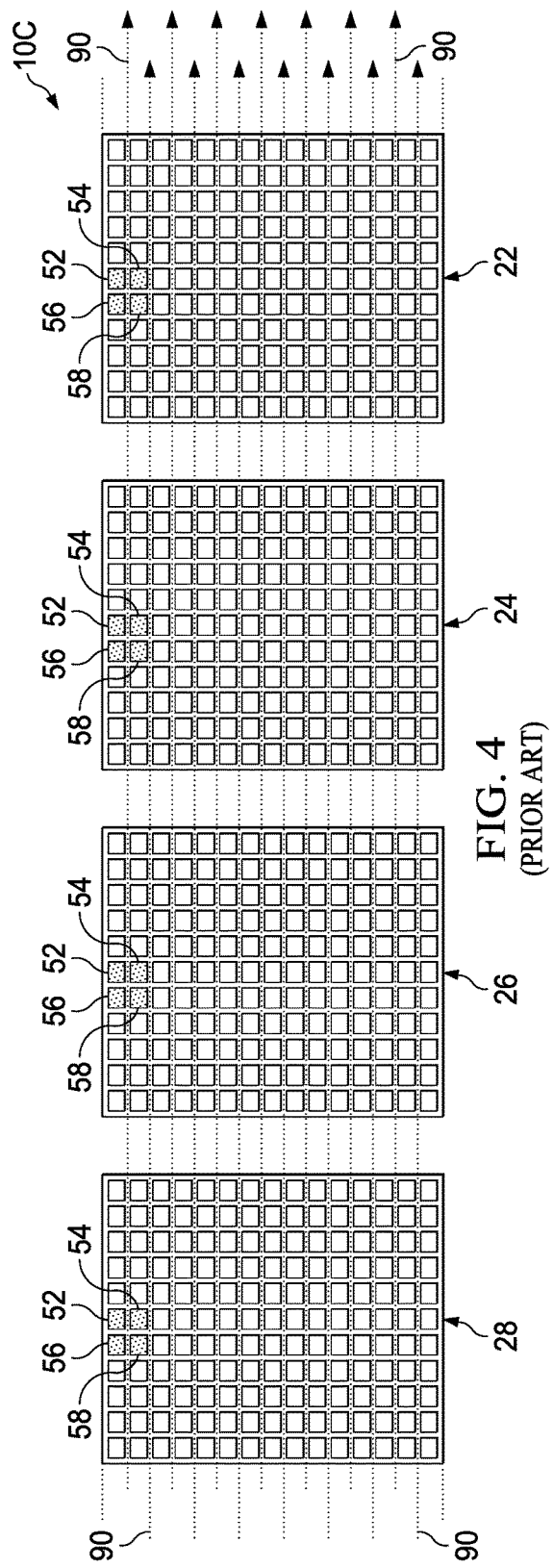
FIG. 4 is a top plan view of the leadframe strip of FIG. 3, illustrating prior art channel 4 processes performed thereon.

FIG. 4 is a top plan view of the leadframe strip 10C after channel 3 processing, illustrating prior art channel 4 processes performed thereon. The leadframe strip 10C is reoriented by 90 degrees rotation on the saw table 67 (shown in FIG. 1C). Then a plurality of longitudinally extending saw cuts 90 are made that separate laterally adjacent leadframe portions 50. Thus, the leadframe portions 50, after channel 4 processing, are all separated and associated with separate IC packages. However, four leadframe portions 52, 54, 56, 58 (now individual IC packages) from each panel 22, 24, 26, 28, FIG. 1B have undesirable blackened leads 61, FIG. 1C.

FIGS. 5-8 illustrate an example leadframe panel singulation process that eliminates blackened leads.

Figure 5A:
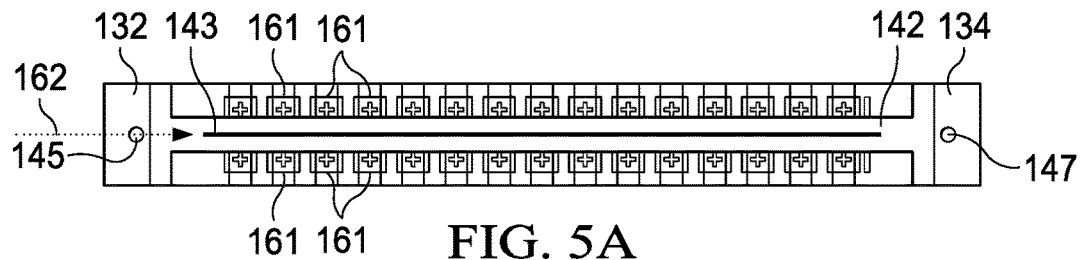
FIG. 5A is a detail top plan view of an example connector portion between two leadframe panels of FIG. 5 that is to be cut.
Figure 5:
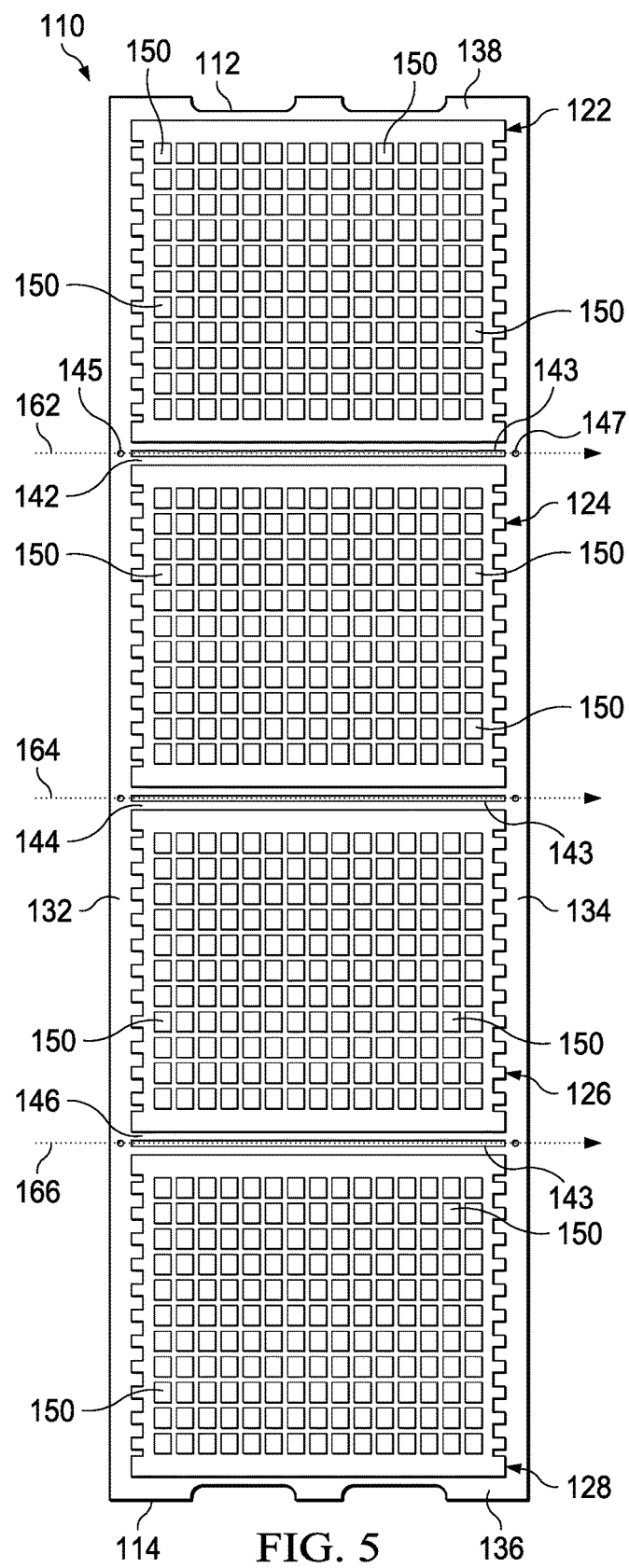
FIG. 5 is a top plan view of a die-mounted and molded leadframe strip illustrating example channel 1 processes performed thereon.
Figure 5B:
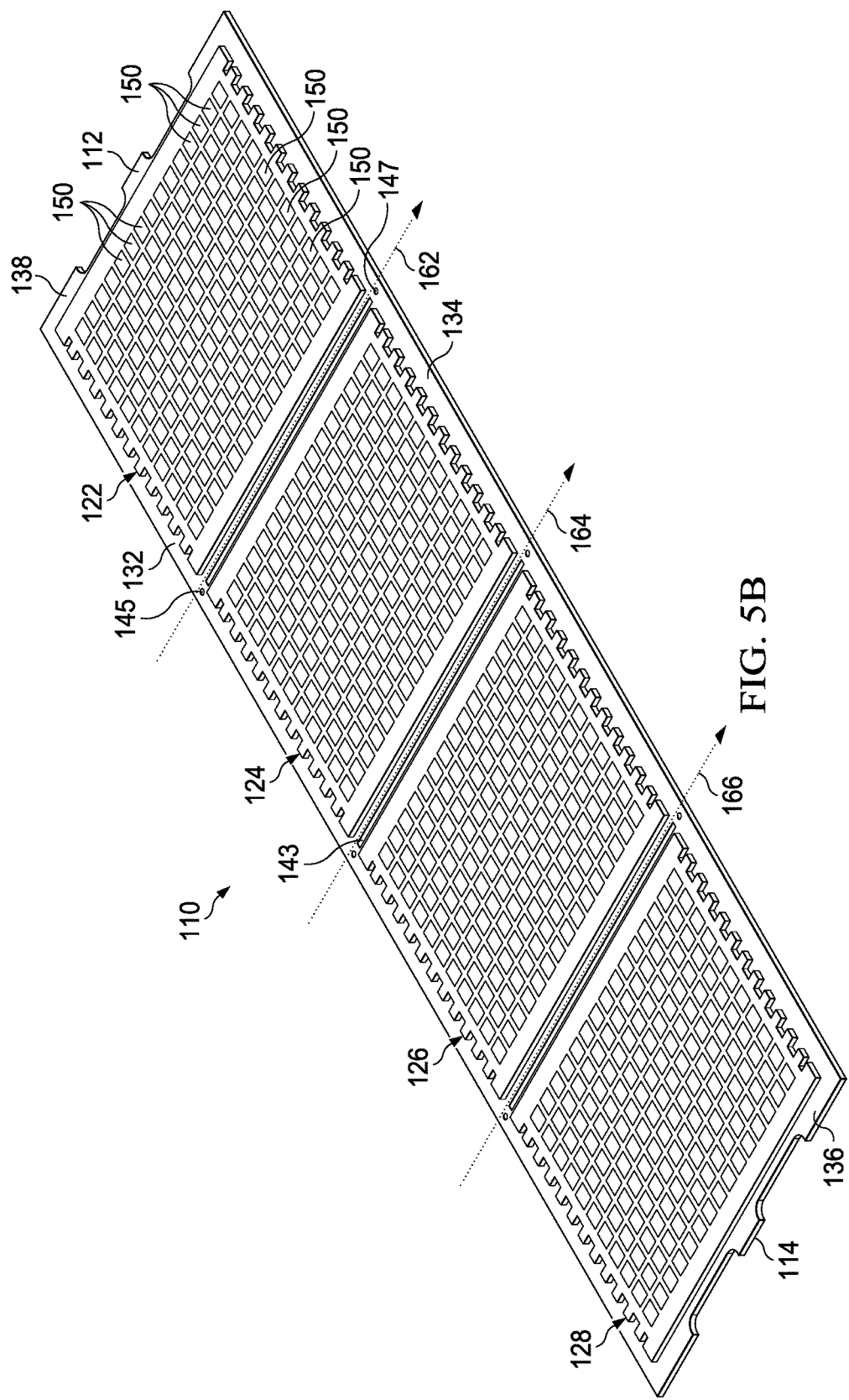
FIG. 5B is an isometric view of the leadframe strip of FIG. 5.
Figure 5C:
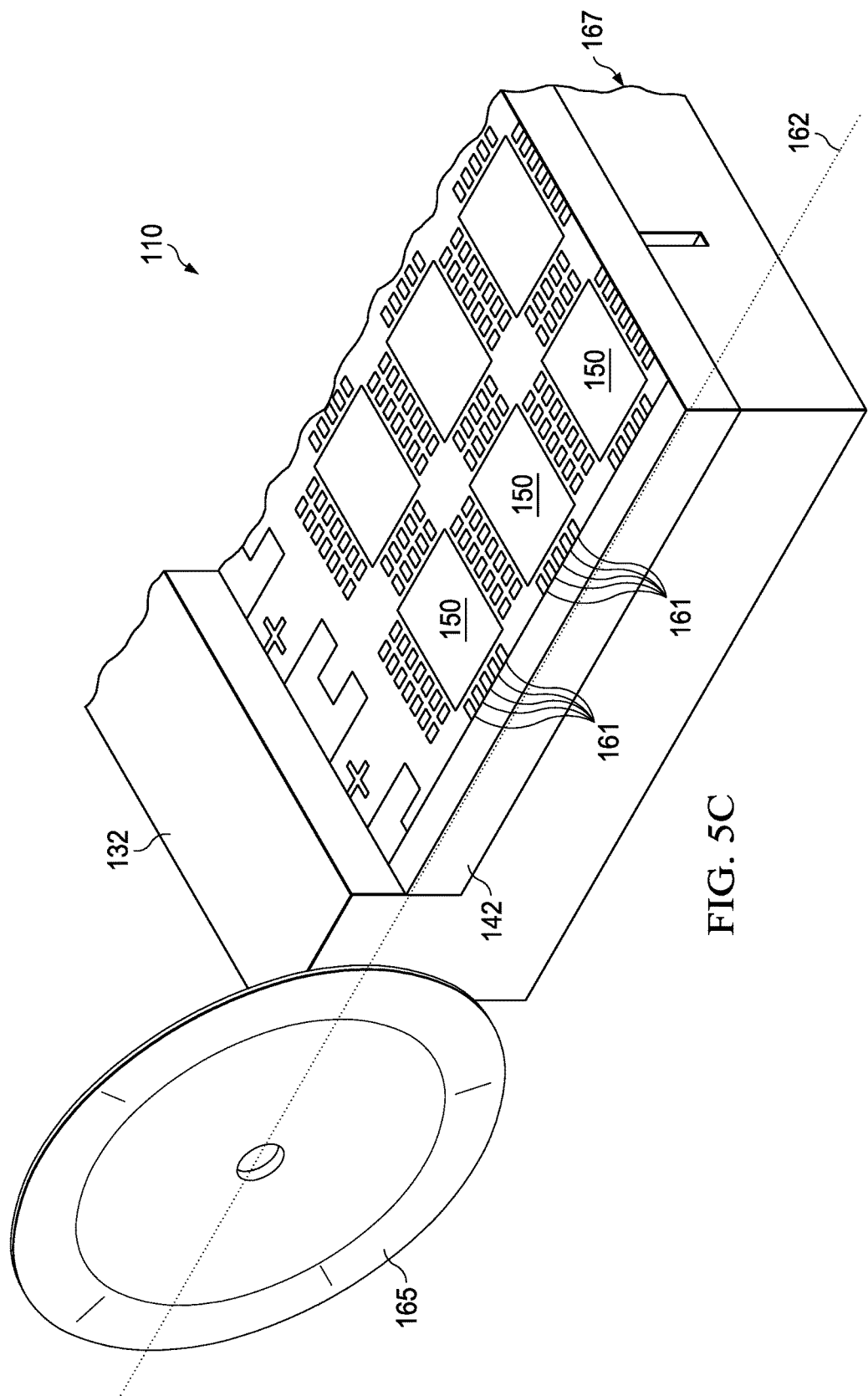
FIG. 5C is an enlarged, broken away, isometric view of a sawed portion of the leadframe strip of FIG. 5 supported on a saw table.

FIG. 5 is a top plan view of an example die-mounted and molded leadframe strip 110, illustrating channel 1 processes performed thereon. FIG. 5A is a detail top plan view of illustrating a connector portion 142 between two leadframe panels. FIG. 5B is an isometric view of the leadframe strip 110 of FIG. 5. FIG. 5C is a broken away isometric view of a sawed portion of the leadframe strip 110 of FIG. 5 supported on a saw table 167.

The leadframe strip 110 illustrated in FIGS. 5-5C has first and second longitudinal ends 112, 114. First second third and fourth panels 122, 124, 126, 128 are positioned between the two longitudinal ends 112, 114. First and second longitudinally extending rails 132, 134 are located on lateral sides of the panels 122, etc. The panels 122, 124, 126, 128 have a smaller thickness than the rails 132, 134, e.g., half the thickness of the rails. First and second laterally extending end rails 136, 138 are positioned at the ends 112, 114 of the leadframe strip 110. The four panels 122, 124, 126, 128 are connected to one another by first, second and third metal plate connector portions 142, 144, 146, which have the same thickness as the panels 122, etc.

Each of the four panels 122, 124, 126, 128 comprises an array of integrally connected leadframe portions 150, which are arranged in a rectangular grid of rows and columns. In the illustrated embodiments of FIGS. 5-5C, the rectangular grid has 11 laterally extending rows and 15 longitudinally extending columns of integrally connected leadframes portions 150. However, the grid may have any desired number of such rows and columns. To begin the channel 1 singulation process, the leadframe strip 110 is placed on a saw table 167, FIG. 5C. Lateral saw cuts 162, 164, 166 are made along three saw paths ("saw streets") in this new channel 1 process as illustrated in FIGS. 5 and 5B. These three lateral saw cuts 162, 164, 166 extend entirely across each panel and through the rails 132, 134 on each lateral side of the panels 122, etc. Unlike the saw cuts in the prior art channel 1 process, the saw cuts 162, 164, 166 are each made in a corresponding one of the panel connector portions 142, 144, 146 and, more precisely, each saw cut 162, 164, 166 is aligned with a laterally extending slot 143 in the corresponding connector portion 142, 144, 146.

A top detail view of connector portion 142 is illustrated in FIG. 5A. Each connector portion comprises a laterally extending slot 143 at a central portion thereof, which extends nearly to the rails 132, 134. An indexing hole 145, 147 is provided in each of the rails 132, 134 opposite the ends of the slot 143. In one embodiment the slot 143 has a width of 0.500 mm and the blade thickness of the saw blade 165 making the saw cuts 162, 164 and 166 is about 0.350 mm. Since the slot 143 is wider than the saw blade 165, the saw blade does not cut any metal as it moves along the slot 143. The saw blade also does not cut any metal as it passes through the indexing holes 145, 147 located near the ends of each slot 143. Blade heating caused by cutting through the small portion of each rail 132, 134 that is actually cut by the saw blade 165 is not a problem because the leadframe leads are too far away from the saw cutting path to be affected. Also, cutting in alignment with slot 143 extends blade life because once the blade enters the slot 143, it does not come into cutting contact with any metal until it leaves the slot. Also, the cut passes through the indexing holes 145, 147, which, like the slot, comprise empty space that creates no blade wear.

Figure 6:
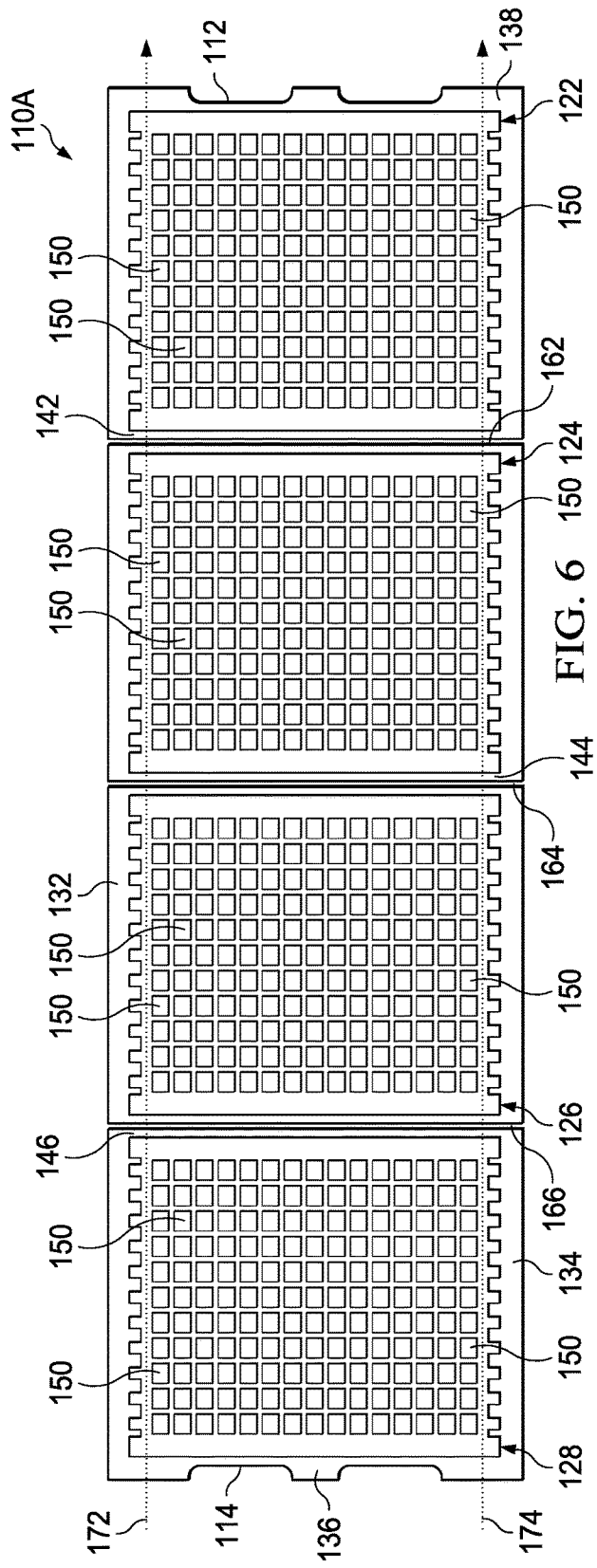
FIG. 6 is a top plan view of the leadframe strip of FIG. 5 illustrating example channel 2 processes performed thereon.

FIG. 6 illustrates channel 2 processes performed after the leadframe strip assembly 110A that leaves the channel 1 process has been rotated 90 degrees relative to the FIG. 5 orientation. In this channel 2 process longitudinal saw cuts 172, 174 are made in the panels 120, 122, 124 and 126 adjacent to each longitudinally extending rail 132, 134. This process, in addition to the process of channel 1 causes each of the longitudinal rails 132 to 134, which have each been cut into four separate pieces in the channel 1 process, to be severed from the leadframe assembly 110A. These multiple rail pieces are then removed, for example by hand, after sawing operations are completed.

Figure 7:
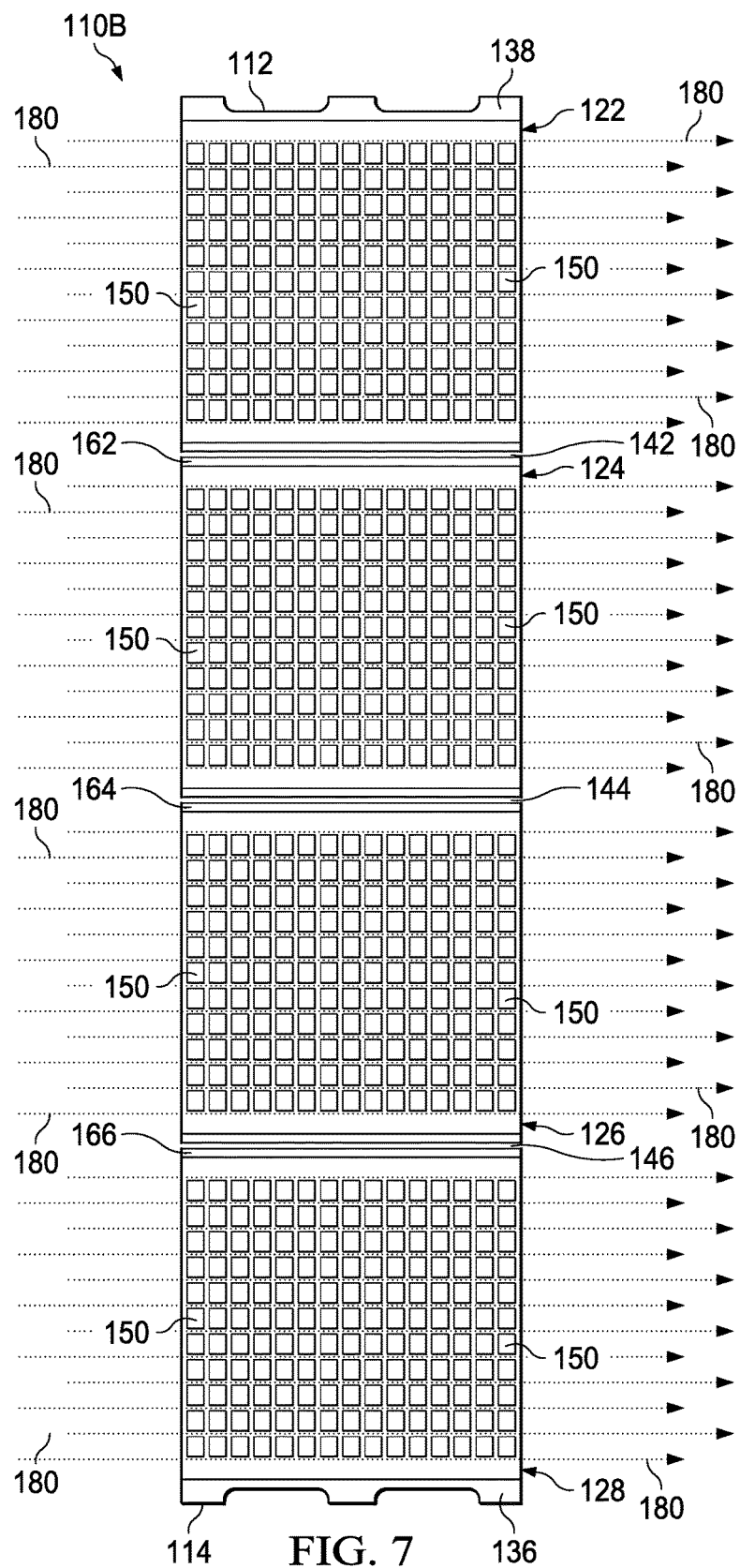
FIG. 7 is a top plan view of the leadframe strip of FIG. 6 illustrating example channel 3 processes performed thereon.

FIG. 7 illustrates a leadframe sheet assembly 10B with rails 132, 134 removed. The assembly 10B has been rotated 90 degrees on the saw table 167 (shown in FIG. 5C) from its orientation in FIG. 6. The channel 3 processes are then performed, i.e., a plurality of lateral saw cuts 180 are made that separate longitudinal adjacent leadframe portions 150. In the illustrated embodiment in which there are 11 rows of leadframe portions 150 in each panel, 12 parallel cuts are made in each panel, including the cuts that sever the associated laterally extending end rails 136, 138 and/or panel connector portions 142, 144, 146.

Figure 8:
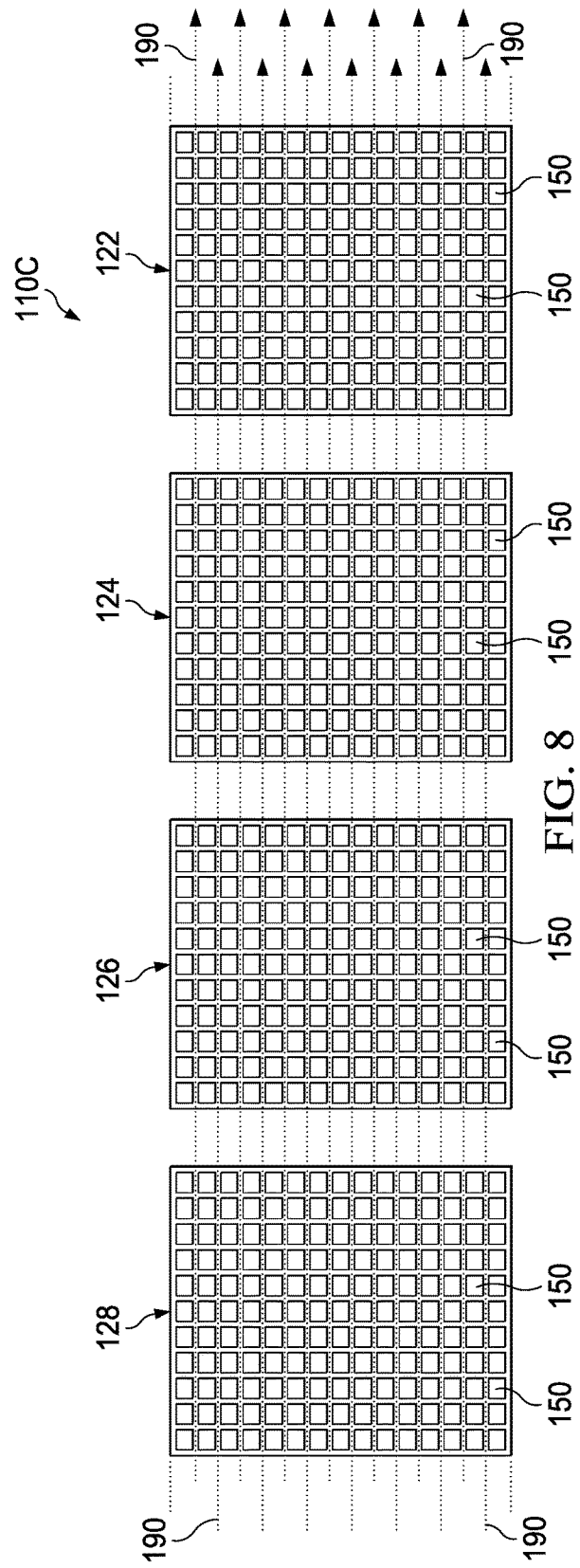
FIG. 8 is a top plan view of the leadframe strip of FIG. 7 illustrating example channel 4 processes performed thereon.

In FIG. 8, the leadframe assembly 110C has been rotated 90 degrees from the orientation shown in FIG. 7. The end rails 136, 138 and panel connector portions 142, 144, 146 have been removed and the channel 4 processes are commenced. The channel 4 processes include making longitudinally extending saw cuts 190 that separate laterally adjacent leadframe portions 150 into a plurality of separate IC packages such as IC package 200 illustrated in FIG. 9.

Figure 9:
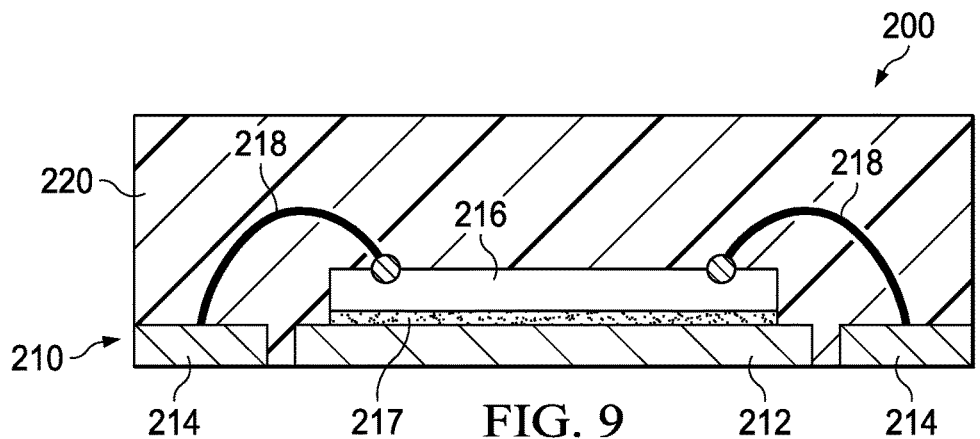
FIG. 9 is a cross-sectional elevation view of an example integrated circuit (IC) package produced by the new methodology described herein.

FIG. 9 is a cross-sectional elevation view of an IC package 200 produced by the processes described herein with reference to FIGS. 5-8. The IC package 200 may include a leadframe 210 having a die attach pad 212 and a plurality of leads 214. At least one die 216 is attached, as with die attach epoxy 217, to the die attach pad 212. Contact areas on the die 216 may be conventionally electrically connected with bond wires 218 to a plurality of the leads 214. The entire assembly is covered with plastic mold compound 220, such as plastic, through which portions of the leadframe 210 are exposed.

Figure 10:
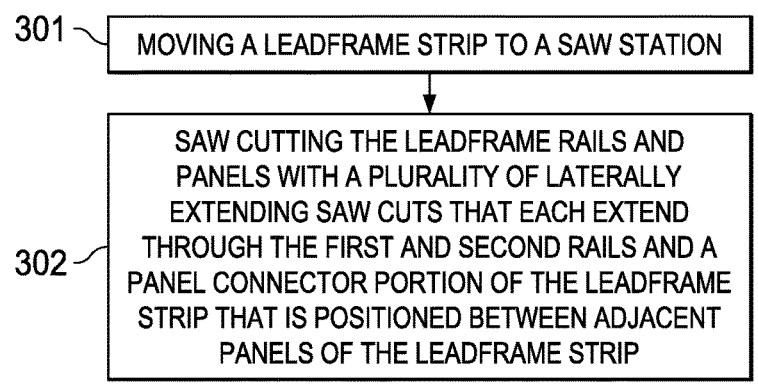
FIG. 10 is a flow diagram that illustrates an example method of processing a leadframe strip.

FIG. 10 is a flow diagram that illustrates a method of processing a leadframe strip having opposite first and second longitudinal ends and a plurality of leadframe panels positioned between the first and second longitudinal ends, each of said leadframe panels comprising an array of leadframe portions. The method includes, as shown at block 301, moving the leadframe strip to a saw station, and, as shown at block 302, saw cutting the leadframe rails and panels with a plurality of laterally extending saw cuts that each extend through the first and second rails and a panel connector portion of the leadframe strip that is positioned between adjacent panels of the leadframe strip.

Figure 11:
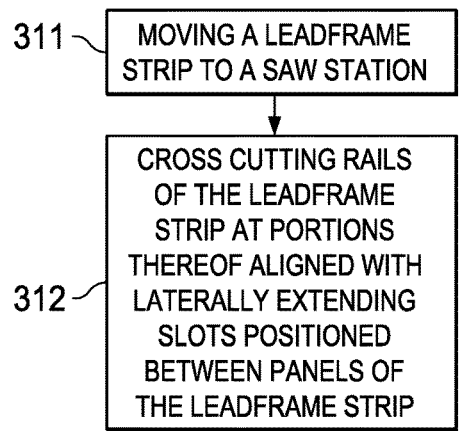
FIG. 11 is a flow diagram of an example method of reducing blade heating during leadframe strip singulation

FIG. 11 is a flow diagram that illustrates a method of reducing blade heating during leadframe strip singulation. The method includes, as shown at block 311, moving the leadframe strip to a saw station. The method also includes, as shown at block 312, cross cutting rails of the leadframe strip at portions thereof aligned with laterally extending slots positioned between panels of the leadframe strip.

Embodiments of molded leadframe singulation processes that extends the life of singulation saw blades and the various leadframe strip assemblies produced during these processes are disclosed in detail herein. Various alternative embodiments of such processes and leadframe strip assemblies will become obvious to those skilled in the art after reading this disclosure. It is intended for the language of the claims to be construed broadly to cover such alternative embodiments, except as limited by the prior art.

What is claimed is:

1. A method of processing a molded leadframe strip comprising:
    moving the molded leadframe strip to a sawing station;
        the molded leadframe strip having a plurality of leadframe panels positioned between opposite first and second longitudinal ends and a longitudinally extending leadframe rail positioned on opposite lateral sides of the molded leadframe strip, and laterally extending slots positioned between each of the plurality of leadframe panels, each of the leadframe panels comprising an array of leadframe portions; and
    cutting the molded leadframe strip along the laterally extending slots.

2. The method of claim 1 further comprising, prior to moving the molded leadframe strip to the sawing station:
    mounting a die on each of the leadframe portions; and
    covering the leadframe portions and dies in mold compound.

3. The method of claim 2 further comprising cutting through the mold compound covering the leadframe portions and dies with a plurality of saw cuts to separate the leadframe portions into a plurality of leadframe packages.

4. The method of claim 1, wherein the laterally extending slots are part of a panel connector portion of the molded leadframe strip positioned between adjacent panels of said leadframe strip.

5. The method of claim 4 further comprising making saw cuts that are each aligned with the laterally extending slot in each of the panel connector portions.

6. The method of claim 5 further comprising: saw cutting the molded leadframe strip with a plurality of longitudinally extending saw cuts that separate the longitudinally extending rails from the plurality of panels.

7. The method of claim 6, further comprising removing portions of the rails separated by the saw cuts.

8. The method of claim 7 further comprising separating longitudinally adjacent leadframe portions with a plurality of laterally extending saw cuts.

9. The method of claim 7 further comprising separating laterally adjacent leadframes portions with a plurality of longitudinally extending saw cuts.

10. A method of reducing blade heating during a molded leadframe strip singulation comprising:
  moving the molded leadframe strip to a saw station; and
  cross cutting rails of the molded leadframe strip at portions thereof aligned with laterally extending slots positioned between panels of the leadframe strip.

* * * * *